(12) United States Patent
Xu

(10) Patent No.: US 6,566,700 B2
(45) Date of Patent: May 20, 2003

(54) CARBON-CONTAINING INTERFACIAL LAYER FOR PHASE-CHANGE MEMORY

(75) Inventor: Daniel Xu, Mountain View, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/975,272

(22) Filed: Oct. 11, 2001

(65) Prior Publication Data

US 2003/0073295 A1 Apr. 17, 2003

(51) Int. Cl.[7] .................. H01L 27/108; H01L 29/76; H01L 29/94; H01L 31/119
(52) U.S. Cl. ............... 257/296; 257/4; 257/77; 257/614; 257/734
(58) Field of Search .............. 257/4, 77, 296, 257/614, 734

(56) References Cited

U.S. PATENT DOCUMENTS 4,433,342 A  *  2/1984  Patel et al. ............... 257/2
5,177,567 A  *  1/1993  Klersy et al. ............. 257/3
5,825,046 A  *  10/1998  Czubatyj et al. ........ 257/2
5,933,365 A  *  8/1999  Klersy et al. ............. 257/2
6,031,287 A  *  2/2000  Harshfield ............... 257/734
6,404,665 B1 *  6/2002  Lowrey et al. ........... 257/3

* cited by examiner

Primary Examiner—Eddie Lee
Assistant Examiner—Matthew E. Warren
(74) Attorney, Agent, or Firm—Trop, Pruner & Hu, P.C.

(57) ABSTRACT

A phase-change memory cell may be formed with a carbon-containing interfacial layer that heats a phase-change material. By forming the phase-change material in contact, in one embodiment, with the carbon containing interfacial layer, the amount of heat that may be applied to the phase-change material, at a given current and temperature, may be increased. In some embodiments, the performance of the interfacial layer at high temperatures may be improved by using a wide band gap semiconductor material such as silicon carbide.

18 Claims, 5 Drawing Sheets

CARBON-CONTAINING INTERFACIAL LAYER FOR PHASE-CHANGE MEMORY

BACKGROUND

This invention relates generally to memories that use phase-change materials.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, thin-film chalcogenide alloy materials may be particularly suitable.

The phase-change may be induced reversibly. Therefore, the memory may change from the amorphous to the crystalline state and may revert back to the amorphous state thereafter or vice versa. In effect, each memory cell may be thought of as a programmable resistor, which reversibly changes between higher and lower resistance states.

In some situations, the cell may have a large number of states. That is, because each state may be distinguished by its resistance, a number of resistance determined states may be possible allowing the storage of multiple bits of data in a single cell.

A variety of phase-change alloys are known. Generally, chalcogenide alloys contain one or more elements from column VI of the periodic table. One particularly suitable group of alloys are GeSbTe alloys.

A phase-change material may be formed within a passage or pore defined through a dielectric material. The phase-change material may be coupled to contacts on either end of the passage.

The phase-change may be induced by heating the phase-change material. In some embodiments of phase-change memories, a current is applied through a lower electrode that has sufficient resistivity or other characteristics to heat the phase-change material and to induce the appropriate phase change. In some embodiments, the lower electrode may produce temperatures on the order of 600° C.

One problem with existing electrode arrangements is that the higher the temperature, the lower the resistivity of the material. Thus, as the lower electrode is heating up in order to induce the phase change, it progressively becomes less resistive, thereby decreasing the amount of heat that is generated.

Thus, there is a need for a controllable way to provide sufficient resistance proximate to the phase-change material even at elevated temperatures.

DETAILED DESCRIPTION

Figure 1:
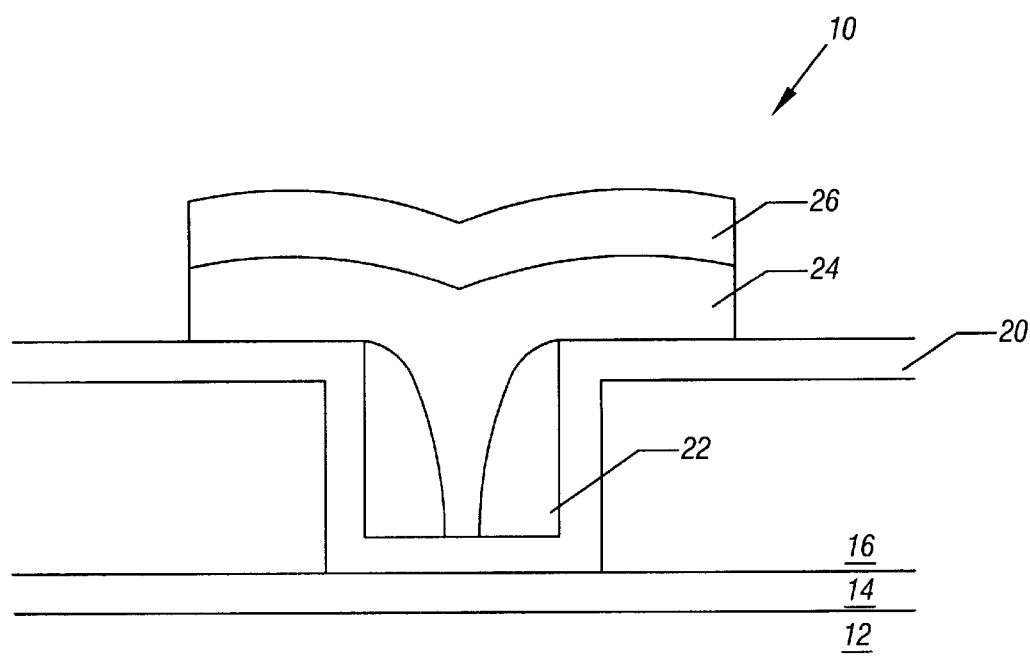
FIG. 1 is a greatly enlarged, cross-sectional view in accordance with one embodiment of the present invention.

Referring to FIG. 1, a memory cell 10 may include a phase-change material layer 24. The phase-change material layer 24 may be sandwiched between an upper electrode 26 and a lower electrode 14. In one embodiment, the lower electrode 14 may be cobalt silicide. However, the lower electrode 14 may be any conductive material. Similarly, the upper electrode 26 may be any conductive material.

The lower electrode 14 may be defined over a semiconductor substrate 12. Over the lower electrode 14, outside the region including the phase-change material layer 24, may be an insulative material 16, such as silicon dioxide or silicon nitride, as two examples. A buried wordline (not shown) in the substrate 12 may apply signals and current to the phase-change material 24 through the lower electrode 14.

A carbon-containing interfacial layer 20 may be positioned between the phase-change material layer 24 and the insulator 16. In one embodiment, a cylindrical sidewall spacer 22 may be defined within a tubular pore that is covered by the carbon-containing interfacial layer 20 and the phase-change material layer 24.

In one embodiment of the present invention, the carbon-containing interfacial layer 20 may be formed of silicon carbide. Silicon carbide, in its single crystal form, is a wide band gap semiconductor with alternating hexagonal planes of silicon and carbon atoms. Silicon carbide may be heated to 600° C. in operation and may have a resistivity that does not significantly go down with increasing temperature. Therefore, silicon carbide is very effective for heating the phase-change material layer 24. Again, it is desirable to heat the phase-change material layer 24 to induce changes of the phase-change material layer 24 between the amorphous and crystalline states.

The interfacial layer 20 does not increase its conductivity with increasing temperature to the same degree as other available materials such as cobalt silicide. The reduced resistivity at increased temperature makes conventional materials less than ideal as heating electrodes for the phase-change material layer 24. At relatively high temperatures, such as 600° C., where the resistivity of other materials decreases, the effectiveness of the interfacial layer 20 as a heater to induce phase changes is not substantially diminished.

Silicon carbide, in particular, is less prone to losing its resistivity at higher temperatures because it is a wide band gap material. Other wide band gap materials include galium nitride and aluminum nitride. Other carbon containing materials that may be utilized as the interfacial layer 20 in embodiments of the present invention may include sputtered carbon and diamond.

The interfacial layer 20 may be deposited, for example, by chemical vapor deposition in the case of silicon carbide and by sputtering in the case of diamond or carbon. Other layer forming techniques may be utilized as well.

In some embodiments, it may be desirable to dope the interfacial layer 20 to increase its conductivity. In some embodiments, undoped silicon carbide, for example, may have too high a resistivity, resulting in either too high a temperature or too much voltage drop across the electrodes 14 and 26. Thus, ion implantation, for example, may be utilized to dope the layer 20 with P-type or N-type impurities to improve its conductivity after annealing.

In some embodiments of the present invention, a layer (not shown) may be provided to improve the adhesion between the phase-change material layer 24 and the carbon-containing interfacial layer 20. Suitable adhesion promoting layers may include any conductive materials including titanium, titanium nitride and Tungsten, as a few examples.

Figure 2:
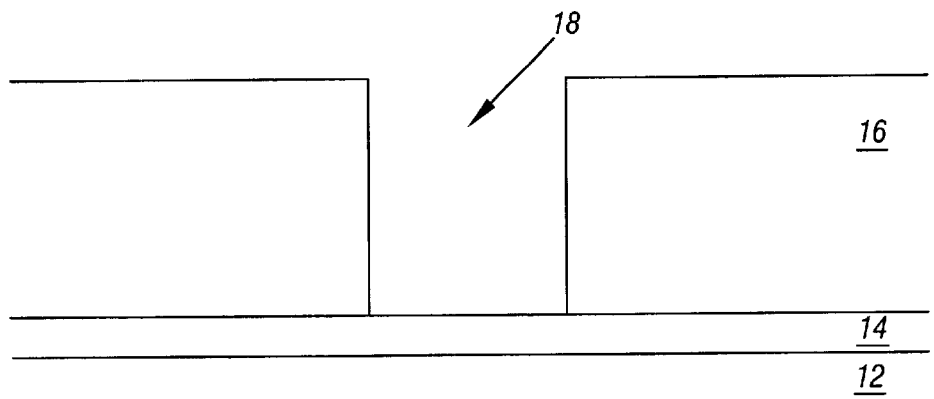
FIG. 2 is a greatly enlarged, cross-sectional view of an early stage of fabrication of the device shown in FIG. 1 in accordance with one embodiment of the present invention.

Referring to FIG. 2, a semiconductor substrate 12 may be covered with the lower electrode 14 in one embodiment. The electrode 14 may then be covered by an insulator 16 and a suitable pore 18 formed through the insulator 16.

Figure 3:
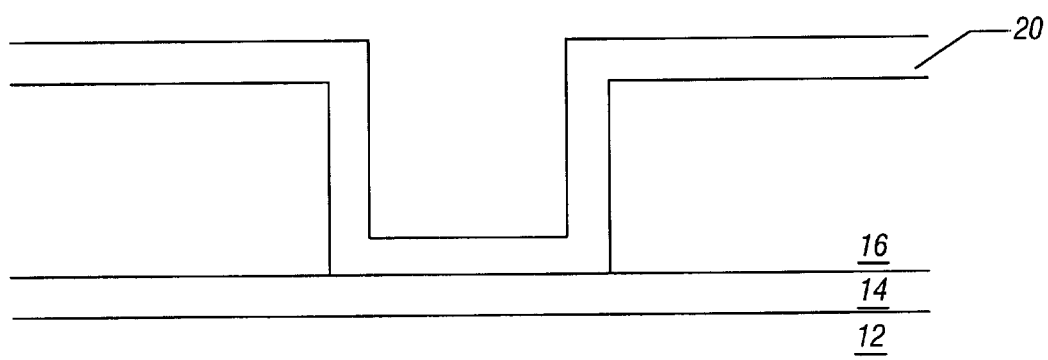
FIG. 3 is a greatly enlarged, cross-sectional view of the embodiment shown in FIG. 2 at a subsequent stage of manufacturing in accordance with one embodiment of the present invention.
Figure 4:
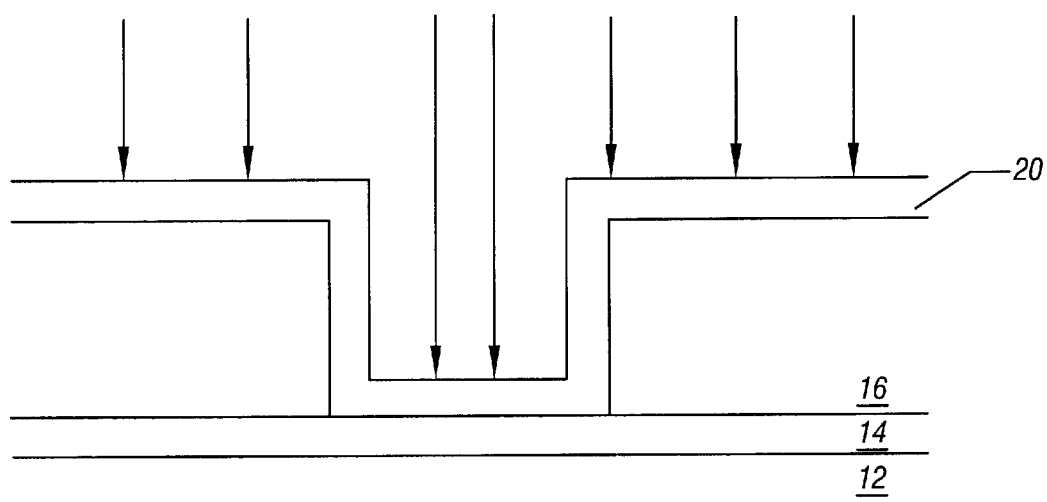
FIG. 4 is a greatly enlarged, cross-sectional view of the embodiment shown in FIG. 3 at the subsequent stage of manufacturing in accordance with one embodiment of the present invention.

The resulting structure may be blanket deposited, for example using chemical vapor deposition, with the carbon-containing interfacial layer 20 as shown in FIG. 3. Thereafter, in some embodiments, the carbon-containing interfacial layer 20 may be subjected to an ion implantation, as shown in FIG. 4, to increase its conductivity and to decrease its resistivity after annealing.

Figure 5:
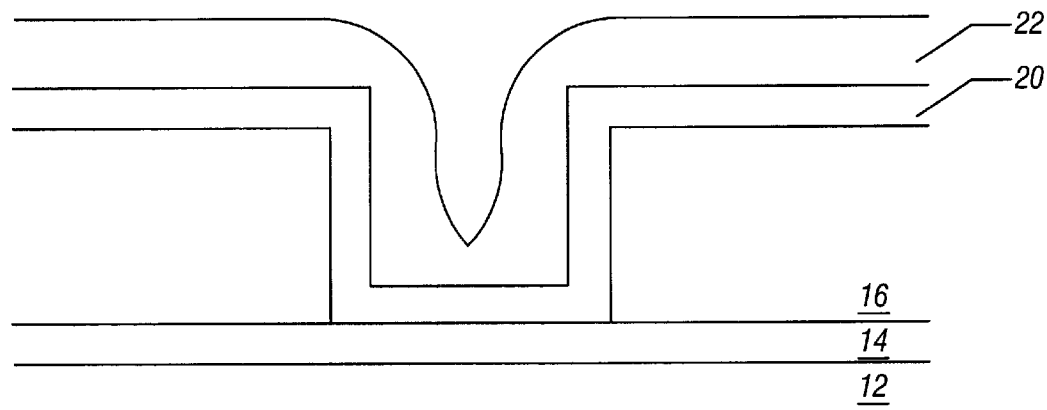
FIG. 5 is a greatly enlarged, cross-sectional view of the embodiment of FIG. 4 at a subsequent stage of manufacturing in accordance with one embodiment of the present invention.
Figure 6:
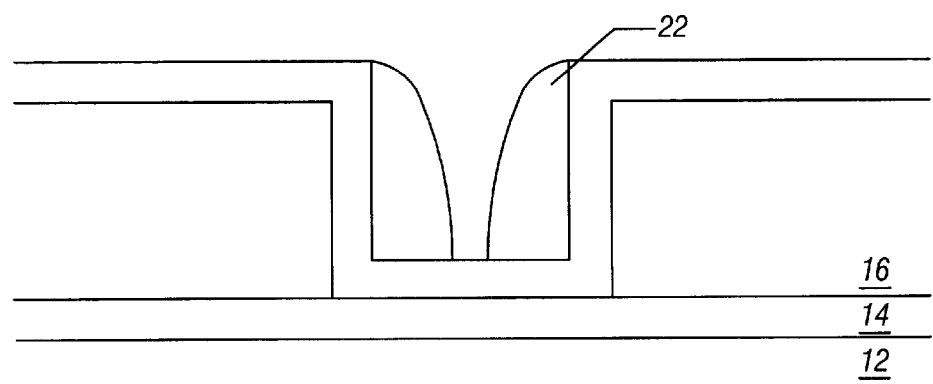
FIG. 6 is a greatly enlarged, cross-sectional view of a subsequent stage of manufacturing in accordance with one embodiment of the present invention.

As shown in FIG. 5, a spacer material 22 may be deposited over the layer 20. The spacer material 22 may, in one embodiment, be a chemical vapor deposited oxide. The oxide material 22 may then be subjected to an anisotropic etch to form the cylindrical sidewall spacer 22, shown in FIG. 6, in the pore 18.

Figure 7:
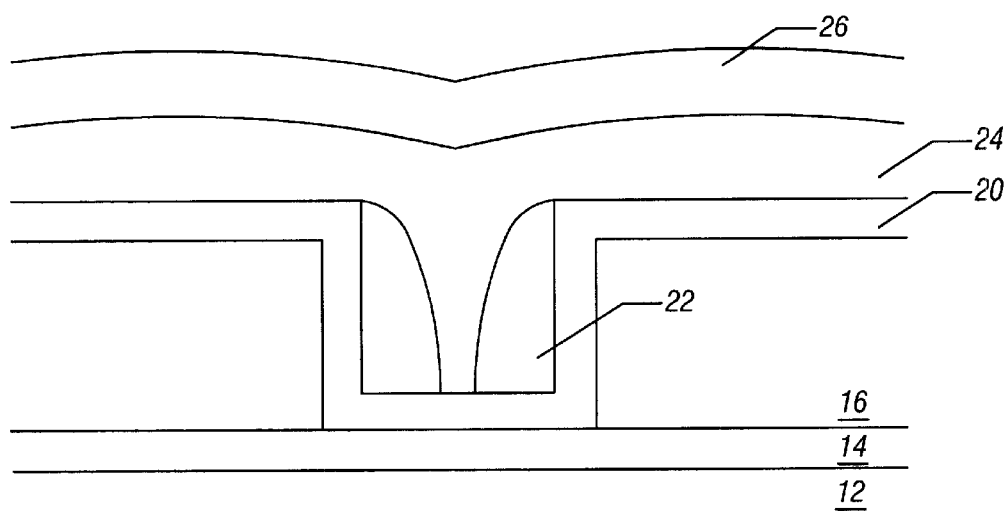
FIG. 7 is an enlarged, cross-sectional view of still a subsequent stage of manufacturing in accordance with one embodiment of the present invention.

Turning to FIG. 7, in one embodiment, the phase-change material layer 24 may be formed into the pore 18 and specifically into the region defined by the sidewall spacer 22 so as to contact the layer 20. An upper electrode 26 may be deposited over the phase-change material 24. Then, the electrode 26 and the phase-change material 24 may be patterned and etched to form the structure shown in FIG. 1.

Through the use of a carbon-containing interfacial layer 20, the resistivity of the phase-change material heater may be substantially increased while at the same time improving the heating performance of the heater at high temperatures. The heater effectively includes the series combination of the lower electrode 14 and the carbon-containing interfacial layer 20. However, a series resistive combination is dominated by the element with the higher resistance, which may be the carbon-containing interfacial layer 20 in some embodiments. As a result, the resistance of the series combination of layers 20 and 14 may be dominated by the resistance of the interfacial layer 20.

Figure 8:
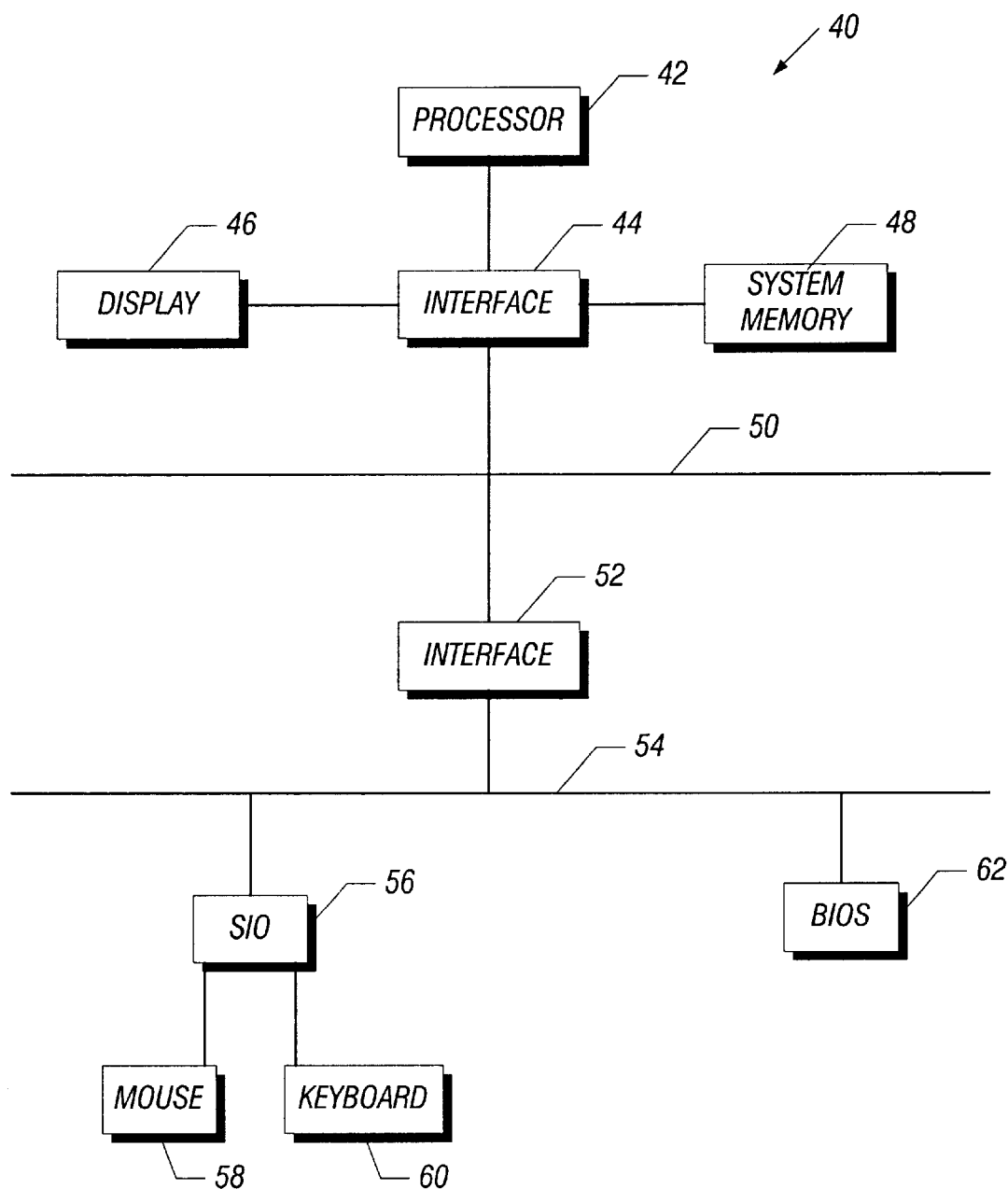
FIG. 8 is a schematic depiction of a system in accordance with one embodiment of the present invention.

Referring to FIG. 8, the memory cell shown in FIG. 1 may be replicated to form a memory array including a large number of cells. That memory may be utilized as a memory of a wide variety of processor-based systems such as the system 40 shown in FIG. 8. For example, the memory may be utilized as the system memory or other memory in a variety of personal computer products such as laptop products or desk top products or servers. Similarly, the memory may be utilized in a variety of processor-based appliances. Likewise, it may be used as memory in processor-based telephones including cellular telephones.

In general, the use of the phase-change memory may be advantageous in a number of embodiments in terms of lower cost and/or better performance. Referring to FIG. 8, the memory 48, formed according to the principles described herein, may act as a system memory. The memory 48 may be coupled to a interface 44, for instance, which in turn is coupled between a processor 42, a display 46 and a bus 50. The bus 50 in such an embodiment is coupled to an interface 52 that in turn is coupled to another bus 54.

The bus 54 may be coupled to a basic input/output system (BIOS) memory 62 and to a serial input/output (SIO) device 56. The device 56 may be coupled to a mouse 58 and a keyboard 60, for example. Of course, the architecture shown in FIG. 8 is only an example of a potential architecture that may include the memory 48 using the phase-change material.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a surface;
   a silicon carbide interfacial layer over said surface; and
   a phase-change material over said silicon carbide layer.

2. The memory of claim 1 wherein said surface includes a conductive layer over a semiconductor substrate.

3. The memory of claim 1 wherein said silicon carbide layer is doped with conductivity-type determining impurities.

4. The memory of claim 3 including an insulator positioned over said surface, a pore formed through said insulator, said carbon-containing interfacial layer formed in said pore over said surface.

5. The memory of claim 4 wherein said phase-change material is formed on said carbon-containing interfacial layer and in said pore.

6. The memory of claim 5 including a sidewall spacer in said pore.

7. The memory of claim 6 wherein said sidewall spacer is positioned between said interfacial layer and said phase-change material.

8. The memory of claim 1 wherein said phase-change material includes a chalcogenide material.

9. An electronic device comprising:
   digital signal processor; and
   a memory coupled to said processor, said memory including a surface, a silicon carbide interfacial layer over said surface and a phase-change material over said silicon carbide layer.

10. The device of claim 9 wherein said electronic device is a storage device.

11. The device of claim 10 wherein said storage device is part of a computer.

12. The device of claim 11 including a processor, an interface and a bus coupled to said storage.

13. A memory comprising:
    a semiconductor substrate;
    a silicon carbide layer positioned over said substrate; and
    a phase-change material over said silicon carbide layer.

14. The memory of claim 13 including a conductive layer between said semiconductor substrate and said silicon carbide layer.

15. The memory of claim 14 including an insulator over said conductive layer, said insulator having a pore defined therein, and said phase-change material and said silicon carbide layer being formed in said pore.

16. The memory of claim 13 wherein said silicon carbide layer is doped.

17. The memory of claim 16 wherein said phase-change material includes chalcogenide.

18. The memory of claim 17 including a sidewall spacer between said phase-change material and said silicon carbide layer.

* * * * *